US010283642B1

(12) United States Patent
Zaka et al.

(10) Patent No.: US 10,283,642 B1
(45) Date of Patent: May 7, 2019

(54) THIN BODY FIELD EFFECT TRANSISTOR INCLUDING A COUNTER-DOPED CHANNEL AREA AND A METHOD OF FORMING THE SAME

(71) Applicant: GLOBALFOUNDRIES Inc., Grand Cayman (KY)

(72) Inventors: Alban Zaka, Dresden (DE); Ignasi Cortes Mayol, Dresden (DE); Tom Herrmann, Dresden (DE); El Mehdi Bazizi, Dresden (DE); Luca Pirro, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/957,072

(22) Filed: Apr. 19, 2018

(51) Int. Cl.
*H01L 29/786* (2006.01)
*H01L 29/08* (2006.01)

(52) U.S. Cl.
CPC .... *H01L 29/78603* (2013.01); *H01L 29/0847* (2013.01); *H01L 29/78612* (2013.01)

(58) Field of Classification Search
CPC ............ H01L 29/78603; H01L 29/0847; H01L 29/78612
See application file for complete search history.

(56) References Cited

U.S. PATENT DOCUMENTS

| 6,100,567 A * | 8/2000 | Burr ................. H01L 29/78648 257/347 |
| 6,297,104 B1 | 10/2001 | Tyagi et al. |
| 8,426,917 B2 | 4/2013 | Sleight et al. |
| 8,629,503 B2 | 1/2014 | Tan et al. |
| 2006/0220120 A1* | 10/2006 | Horch ................. H01L 29/0634 257/341 |
| 2006/0240629 A1* | 10/2006 | Orlowski .......... H01L 21/76283 438/300 |
| 2007/0158734 A1* | 7/2007 | Chindalore ....... H01L 21/28273 257/315 |

OTHER PUBLICATIONS

Hoentschel et al., "Implementation and Optimization of Asymmetric Transistors in Advanced SOI CMOS Technologies for High Performance Microprocessors," IEEE 1-4244-2377-4/08, pp. 649-652, 2008.
Pavanello et al., "Comparison of Floating-Body Effects in Conventional and Graded-Channel Fully-Depleted Silicon-on-Insulator nMOSFETs," IEEE 0-7803-5766-3/00, 2000.

* cited by examiner

*Primary Examiner* — Yosef Gebreyesus
(74) *Attorney, Agent, or Firm* — Amerson Law Firm, PLLC

(57) ABSTRACT

Manufacturing techniques and related semiconductor devices are disclosed in which the channel region of analog transistors and/or transistors operated at higher supply voltages may be formed on the basis of a very thin semiconductor layer in an SOI configuration by incorporating a counter-doped region into the channel region at the source side of the transistor. The counter-doped region may be inserted prior to forming the gate electrode structure. With this asymmetric dopant profile in the channel region, superior transistor performance may be obtained, thereby obtaining a performance gain for transistors formed on the basis of a thin semiconductor base material required for the formation of sophisticated fully depleted transistor elements.

15 Claims, 8 Drawing Sheets

THIN BODY FIELD EFFECT TRANSISTOR INCLUDING A COUNTER-DOPED CHANNEL AREA AND A METHOD OF FORMING THE SAME

BACKGROUND

1. Field of the Disclosure

Generally, the present disclosure relates to semiconductor devices and manufacturing techniques in which transistor elements may be formed on the basis of a very thin crystalline semiconductor material, which may be formed on a buried insulating layer.

2. Description of the Related Art

The remarkable advances obtained in the field of semiconductor devices have been mainly driven by a continuous reduction of the critical dimensions of circuit elements, thereby increasing packing density and device performance. In highly advanced semiconductor devices, mainly CMOS technology is implemented, since this type of technology typically results in the most efficient tradeoff between cost efficiency and device performance. The CMOS technology is typically based on respective field effect transistors having a channel region whose conductivity is controlled by an appropriate control voltage. The control voltage is typically applied by using an appropriate electrode structure, typically referred to as a gate electrode structure, that includes electrode material(s) separated from the semiconductor material of the channel region by an appropriate dielectric material. In this manner, a capacitive structure is obtained by which the current flow through the channel region may be efficiently controlled on the basis of the gate voltage, while significantly reducing any static and dynamic losses.

Upon controlling the current flow in the channel region from one transistor terminal, typically referred to as a source region, to the other transistor terminal, typically referred to as a drain region, the resulting transistor characteristics, such as threshold voltage, i.e., the voltage at which significant current conduction may be induced, current drive capability, switching speed and the like, may depend on various device parameters. The continuous reduction of critical dimensions of field effect transistors may contribute to an increased overall packing density, which, in turn, provides the possibility of implementing more and more functions into a given chip area. Moreover, in general, reduction of the transistor length and, thus, the gate length or channel length of a field effect transistor may also significantly contribute to superior transistor performance, for instance, in terms of switching speed and the like. In order to take advantage of the reduced gate length of sophisticated field effect transistors, however, several technical challenges have to be addressed, which are associated with the ongoing reduction of the channel length.

For example, effective controllability of the channel region of the transistor elements strongly depends on the capacitive coupling of the gate electrode structure to the channel region and typically requires highly sophisticated measures for maintaining a required capacitive coupling upon reducing the "capacitor area" of the corresponding gate-channel-capacitor. For example, the thickness of the gate dielectric material may be reduced in order to increase the capacitive coupling, while, on the other hand, sufficient dielectric strength has to be preserved in the gate dielectric material in order to meet supply voltage and/or control voltage requirements upon operating the transistor element.

As discussed above, the continuous reduction of the lateral size of circuit elements has resulted in highly complex semiconductor devices incorporating different types of circuit portions, such as control circuitry based on digital components, I/O interfaces, analog circuitry, RF (radio frequency) circuitry and the like. Consequently, the circuit elements of these very different circuit portions may have to meet very different requirements with respect to transistor performance, thereby also requiring significantly different transistor architectures. For example, in certain logic paths of a more or less complex control circuit, increased switching speed and drive current of the respective field effect transistors may be of high priority, thereby requiring extremely reduced gate length dimensions in combination with respectively adapted gate electrode structures. In order to not unduly increase overall power losses, for instance, in the form of static and dynamic leakage currents, sophisticated techniques have been developed to design the respective transistors to be able to operate on the basis of reduced supply voltages of approximately 1 V, or even less, while respective highly complex gate dielectric materials may also have to be used in order to preserve the required channel controllability based on very short gate length dimensions of 30 nm and even less.

In other circuit portions, higher operating voltages may be required, for instance, for matching chip-internal signal processing with externally supplied signals. For example, input/output portions of a complex integrated circuit may frequently operate at elevated supply voltages compared to sophisticated internal control logic, so that supply voltages of 2.5 to 3.3 V may be frequently encountered. Consequently, in view of these increased supply voltages and, thus, gate voltages, respective transistor parameters may have to be adapted, for instance, in terms of appropriate thickness of the gate dielectric material and the like. Similarly, transistor elements for analog device portions may require a significantly different transistor architecture compared to the digital circuit portions, which may be addressed by providing different lateral dimensions, a different type of gate dielectric material and the like.

The ongoing reduction of critical dimensions has resulted in sophisticated semiconductor devices in which, for instance, field effect transistors having a planar device architecture and a gate length of 30 nm and even less may be used in combination with advanced gate electrode structures, including a high-k dielectric material in combination with metal-based electrode materials, wherein, in an attempt to further reduce device dimensions and preserving a planar transistor architecture, thereby avoiding highly complex three-dimensional transistor configurations and the like, several approaches have been proposed.

One promising approach involves the provision of a substantially fully depleted channel region with reduced dopant concentration. This may be accomplished by providing a very thin basic semiconductor material, such as a crystalline silicon material, crystalline silicon/germanium material and the like, with a desired low dopant concentration, or even as an intrinsic material, thereby reducing charge carrier scattering and substantially avoiding non-uniform dopant distribution. Performance of fully depleted transistor elements may be even further enhanced by providing an SOI (silicon- or semiconductor-on-insulator) architecture, in which the thin semiconductor base material is formed on a buried insulating layer of appropriate thickness and material composition, thereby providing reduced parasitic capacitance and optionally additional control mechanisms for controlling the current flow in the very thin channel region, for instance, by applying an appropriate "back bias" or "forward bias" voltage to the semiconductor material formed below the buried insulating layer in order to influence the charge carrier distribution in the channel region.

As discussed above, performance gain is not the only important aspect in the field of semiconductor production. Economic aspects must also be taken into consideration in order to place competitive products on the market. Therefore, in many areas of semiconductor production, very different circuit portions may have to be implemented on the basis of a respective manufacturing platform which may have to provide the capabilities for producing sophisticated digital circuit portions, for instance, based on fully depleted field effect transistors, in combination with other transistor elements to be operated based on elevated supply voltages, as discussed above. For this reason, semiconductor devices and manufacturing techniques may be required in which given performance requirements may have to be met for any type of devices, while using one and the same manufacturing platform without requiring too many additional process steps when forming the different types of transistor elements. Therefore, the transistor elements required for operation at increased voltages, analog circuit portions, I/O circuit portions and the like, may be formed on the basis of a very thin semiconductor base material, which may be highly advantageous for the formation of sophisticated fully depleted transistor elements. It turns out, however, that, when forming transistor elements of increased gate length compared to the fast switching transistors in SRAM areas and critical circuit paths, performance of the former transistor elements may be less than desired when forming complex semiconductor devices.

In view of the situation described above, the present disclosure relates to techniques and semiconductor devices in which transistor elements may be formed on the basis of a thin basic semiconductor layer, while avoiding or at least reducing the effects of one or more of the problems identified above.

SUMMARY OF THE DISCLOSURE

The following presents a simplified summary of the disclosure in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is generally based on the finding that performance of transistor elements formed on the basis of a very thin basic crystalline semiconductor layer, such as a silicon layer, a silicon/germanium layer and the like, may be significantly enhanced by providing an asymmetric dopant profile along the length direction of a channel region for a transistor element that has to be operated on the basis of an increased supply voltage compared to fast switching digital transistor elements and/or that has to be provided with an increased gate length compared to the fast switching transistor elements in order to comply with requirements for analog circuitry and the like. That is, it has been recognized that appropriate engineering of the electric field distribution along the length direction of the channel region may result in a significant improvement of transistor parameters, such as transconductance at low drive currents and the like. To this end, in some illustrative embodiments disclosed herein, appropriate dopant species may be incorporated into a required portion of the channel region, for instance, by ion implantation, plasma treatment, diffusion and the like, thereby forming a counter-doped region at an appropriate lateral position within the channel region so as to provide the desired electric field distribution along the length direction of the transistor element under consideration. In some illustrative embodiments, incorporation of the dopant species may be accomplished prior to forming a respective gate electrode structure, thereby achieving superior flexibility in appropriately determining concentration and position of the counter-doped region within the channel region.

One illustrative method disclosed herein includes forming a channel region for a fully depleted transistor element in a semiconductor layer. The method further includes forming a counter-doped region in the channel region, wherein the counter-doped region is counter-doped with respect to a doped central portion of the channel region. Furthermore, the method includes forming a gate electrode structure above the channel region.

According to another illustrative embodiment disclosed herein, a method includes forming a counter-doped region in a channel region of a transistor element so as to be positioned asymmetrically in a channel length direction with respect to a center of the channel region, wherein the counter-doped region is counter-doped with respect to a doped central portion of the channel region. The method further includes forming a gate electrode structure on the channel region after having formed the counter-doped region.

A further illustrative embodiment disclosed herein relates to a transistor element in a semiconductor device. The transistor element includes a channel region formed in a semiconductor layer positioned on a buried insulating layer, the semiconductor layer having a thickness of approximately 15 nm or less, wherein the channel region comprises a source side channel portion, a doped central channel portion and a drain side channel portion, wherein the source side channel portion is counter-doped with respect to the central channel portion. The transistor element further includes a gate electrode structure formed above the channel region. Additionally, the transistor element includes raised drain and source regions formed laterally adjacent to the gate electrode structure.

BRIEF DESCRIPTION OF THE DRAWINGS

The disclosure may be understood by reference to the following description taken in conjunction with the accompanying drawings, in which like reference numerals identify like elements, and in which.

Figure 1A:
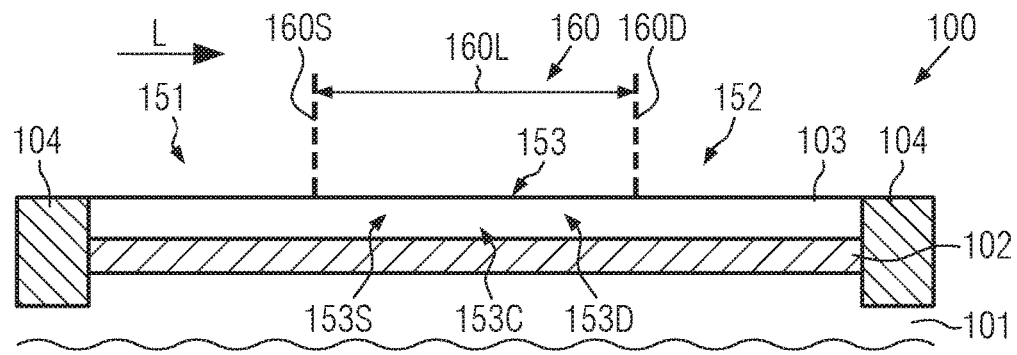
FIG. 1A schematically illustrates a cross-sectional view of a semiconductor device including a basic configuration for forming a transistor element on the basis of a thin crystalline base material formed on a buried insulating layer.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The following embodiments are described in sufficient detail to enable those skilled in the art to make use of the invention. It is to be understood that other embodiments would be evident, based on the present disclosure, and that system, structure, process or mechanical changes may be made without departing from the scope of the present disclosure. In the following description, numeral-specific details are given to provide a thorough understanding of the disclosure. However, it would be apparent that the embodiments of the disclosure may be practiced without the specific details. In order to avoid obscuring the present disclosure, some well-known circuits, system configurations, structure configurations and process steps are not disclosed in detail.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

As previously discussed above, a less than desired performance may be observed for transistor elements requiring a moderately high channel length of approximately 100 nm and higher, for instance, for transistor elements operating on elevated supply voltages, such as greater than 1 V, and/or for transistor elements designed for analog circuit portions, and the like, when these transistor elements may have to be formed on the basis of a platform requiring the provision of a very thin crystalline semiconductor material, as may be required for forming sophisticated fully depleted fast switching transistor elements having a gate length of 30 nm and even less. That is, when forming the channel region of analog and/or "high" voltage transistors on the basis of a moderately thin semiconductor material, such as silicon material, silicon/germanium material and the like, having an initial thickness of 15 nm and even significantly less, it has been recognized that the well-established symmetric configuration of the channel region may result in performance characteristics, such as transconductance, drive current and the like, which may be less than desired, thereby reducing overall performance of highly complex mixed signal circuits and the like.

Moreover, as also briefly discussed above, the extremely thin semiconductor base material may substantially not allow a typical dopant profile engineering at the drain side and the source side of the transistor elements, since significant lateral dopant diffusion from the drain and source regions may not represent a viable process strategy, since the drain and source regions may have to be provided as raised semiconductor regions formed by epitaxial growth techniques with dopant species implemented in situ. In this manner, the required high conductivity may be obtained in the drain and source regions when forming highly conductive metal semiconductor compounds therein, without jeopardizing the incorporation of non-wanted metal species into the extremely thin semiconductor base material. Moreover, the thin basic semiconductor material may not allow the application of implantation processes performed on the basis of high dose, since a respective high degree of amorphization could occur, therefore, resulting in a substantially damaged semiconductor region, since re-crystallization of the damaged areas when formed on a buried insulating material would result in significant residual lattice damage.

According to the principles disclosed herein, the basic transistor configuration may still be maintained, i.e., transistor elements requiring fast switching speeds and, thus, reduced gate length, and transistors having an increased gate length and operating at elevated supply voltages, may be formed on a common manufacturing platform using a very thin basic semiconductor material, as discussed above, wherein, however, transistor performance of the "high" voltage transistors may be increased by providing a modified dopant profile in the channel region of these transistor elements. To this end, in some illustrative embodiments, a performance-enhancing dopant species may be incorporated in the channel region in a non-symmetric manner, i.e., the resulting dopant profile with respect to a central portion of the channel region is non-symmetric, in order to establish a desired profile of the lateral electric field distribution in the channel region. In illustrative embodiments, the non-symmetric dopant profile may be obtained by incorporating a counter-doped region at the source side of a respective transistor element, thereby obtaining a significantly modulated lateral field distribution, i.e., a field distribution along the transistor length direction, which, in turn, may contribute to superior transistor performance. In some illustrative embodiments, the counter-doped region may be incorporated prior to the formation of a gate electrode structure, thereby achieving a high degree of flexibility in selecting an appropriate position, size and dopant concentration and profile for the counter-doped region. That is, upon applying an appropriate masking regime during two or more implantation processes, size and shape, position and lateral dopant profile in the respective counter-doped region may be engineered to meet the required design criteria. Due to the relatively non-critical dimension of the respective gate electrode structures and, thus, of the underlying channel regions, well-established masking regimes may be efficiently applied without unduly introducing variabilities of device characteristics, since respective masking features may be formed with low spatial variability and thus high reproducibility.

In some illustrative embodiments, the masking regime required for defining respective doped regions in the different types of transistor elements may be appropriately modified, substantially without adding any additional masking steps, so as to obtain the modified non-symmetric dopant distribution in the channel region of the relevant transistor elements, thereby achieving superior performance of these transistors without adding complexity to the overall process flow.

Figure 1B:
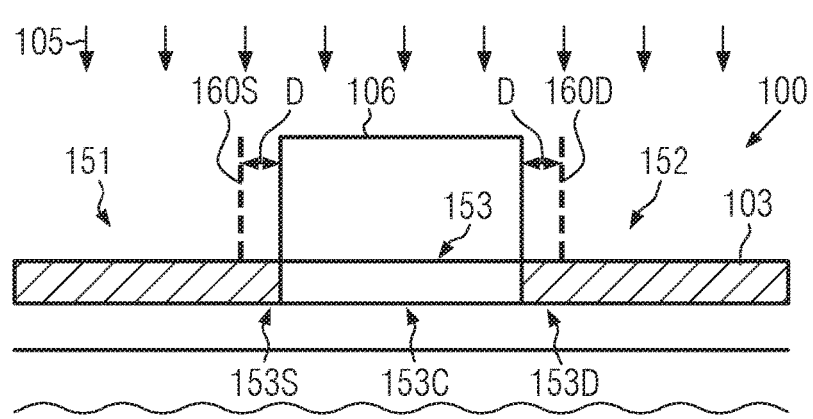
FIG. 1B schematically illustrates the semiconductor device according to conventional concepts in which an appropriate dopant profile may be implemented on the basis of a symmetric mask feature positioned above a central portion of a channel region.
Figure 4:
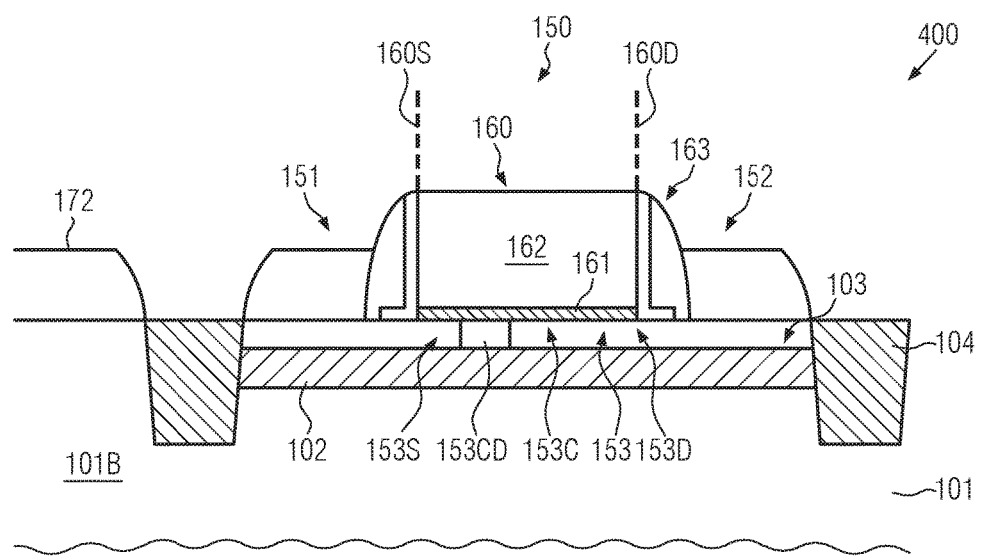
FIG. 4 schematically illustrates a cross-sectional view of a transistor element formed on the basis of device strategies as illustrated in FIGS. 2A-3B, according to illustrative embodiments.
Figure 5:
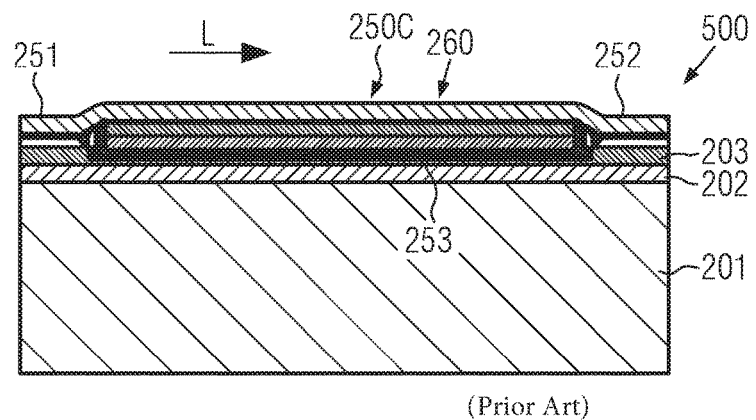
FIG. 5 schematically illustrates a cross-sectional view of the concept or design of a corresponding transistor element with symmetric dopant profile in the channel region, according to conventional strategies.

With reference to FIGS. 1A, 1B and 5, illustrative examples are described of what is believed to be a conventional approach with a symmetric dopant profile in a channel region in order to facilitate the understanding of the principles of the present disclosure. In the meantime, reference is made to FIGS. 2A, 2B, 3A, 3B, 4 and 6A-10D to describe detailed illustrative embodiments.

FIG. 1A schematically illustrates a cross-sectional view of a semiconductor device 100, which may be understood as any semiconductor device requiring the provision of sophisticated field effect transistors, such as fast switching transistors required for control circuitry, such as CPUs and the like, formed on the basis of a fully depleted transistor architecture. Furthermore, the semiconductor device 100 may include transistor elements to be formed on the basis of a respective crystalline semiconductor material that enables the formation of fully depleted transistors, wherein, however, these transistors may have to be operated at higher voltages and/or on the basis of other design criteria compared to a fast switching speed, thereby, for instance, implementing different transistor parameters, such as an increased gate length, a gate electrode structure with increased breakthrough voltage and the like, as also discussed above.

Thus, the semiconductor device 100 may include a substrate 101, at least an upper portion of which may be provided in the form of a crystalline semiconductor material, such as a silicon material, silicon carbide, silicon/germanium, germanium and the like. Furthermore, the device 100 may include a buried insulating layer 102, at least in some device areas, in order to provide an SOI architecture, as also discussed above. The buried insulating layer 102 may include any appropriate dielectric material, such as silicon dioxide, silicon nitride, silicon oxynitride, possibly in combination with high-k dielectric materials, and the like, depending on the overall device requirements. As briefly discussed above, portions of the buried insulating layer 102 may be used as a dielectric material for providing capacitive coupling to conductive material in the substrate 101 for implementing an additional control mechanism for sophisticated transistors, if required. Consequently, in addition to the material composition, a thickness of the buried insulating layer 102 may also be selected in accordance with overall device requirements. For example, a thickness of the layer 102 may range from approximately 10-50 nm.

A crystalline semiconductor layer 103 may be formed on the buried insulating layer 102 and may represent any appropriate semiconductor base material for forming fully depleted channel regions, as discussed above. That is, in particular, the initial thickness of the semiconductor layer 103 may be selected in a range which may allow a fully depleted configuration upon completing a respective transistor element, thereby typically requiring a thickness of 15 nm and significantly less. The semiconductor layer 103 may include crystalline silicon, crystalline silicon/germanium, silicon/carbon and the like, depending on the overall device requirements. In the manufacturing stage shown in FIG. 1A, the semiconductor layer 103 may have implemented therein an appropriate dopant concentration as may be required for the further processing of a specific type of transistor. For example, a lightly N-doped state may have been established in the semiconductor layer 103 during the previous processing, which may, for instance, be appropriate for forming an N-type transistor element in the semiconductor layer 103, i.e., in the portion thereof shown in FIG. 1A. It should be appreciated that other dopant distributions, such as lightly P-doped portions or substantially non-doped portions, may be provided in other areas of the semiconductor device 100, depending on the type of transistor element to be formed therein.

Furthermore, in some illustrative embodiments, isolation regions 104 may be provided in this manufacturing stage, which may represent trench isolation regions extending to a desired depth into the substrate 101. For example, the isolation regions 104 may laterally delineate a region for a transistor element still to be formed and, in the SOI configuration shown in FIG. 1A, may, thus, result in a complete isolation of the respective semiconductor layer 103. That is, the layer 103 is laterally and vertically isolated from any other conductive regions. In other illustrative embodiments, the isolation regions 104 may not be provided in this manufacturing stage and may be formed at any later time.

Moreover, although not yet illustrated, the area of a gate electrode structure 160 still to be formed with respective borders 160S and 160D may be illustrated so as to indicate the size and position of the future gate electrode structure 160. Similarly, a future source region 151 may indicate the position and size of a respective source terminal, while a future drain region 152 may indicate the size and position of the drain region 152 of a transistor element still to be formed. Consequently, a respective dimension, indicated as 160L, defined by the borders 160S, 160D, may, therefore, represent the length dimension of the future gate electrode structure 160, which, in some illustrative embodiments, may have a value of approximately 100 nm and significantly greater, depending on the type of transistor element to be formed. It should be appreciated, however, that the principles discussed herein may also be applied to transistor elements requiring a gate length 160L that is 100 nm and less.

The position and size of the future gate electrode structure 160 may, thus, define a channel region 153 in the semiconductor layer 103, which, therefore, represents the area in the semiconductor layer 103 which may be basically controlled by the future gate electrode structure 160. As will be discussed later on, the substantial homogenous dopant distribution in the channel region 153 may be significantly altered during the further processing so as to obtain a non-symmetric dopant distribution. To this end, the channel region 153 may be considered as being composed of a source side portion 153S, a drain side portion 153D and a central portion 153C, separating the source side portion 153S and the drain side portion 153D.

The semiconductor device 100 as illustrated in FIG. 1A may be formed on the basis of the following processes. Generally, in many strategies, the substrate 101, including the buried insulating layer 102 and the initial semiconductor layer 103, may be provided in the form of an SOI substrate, which may be obtained by specific manufacturing techniques, thereby obtaining, in particular, the semiconductor layer 103 with a desired initial thickness, for instance, 15 nm and significantly less, with a thickness variation of less than approximately 1 nm, thereby ensuring low device variability across the entire substrate 101. Similarly, the buried insulating layer 102 may be provided with well-specified characteristics in terms of material composition, layer thickness and the like. After adapting material characteristics of the layer 103 in specific device areas of the semiconductor device 100, for instance, by one or more of epitaxial growth techniques, etch processes, and subsequent material growth, and the like, respective adjustments of the layer 103 may be applied. To this end, well-established process strategies are available. Moreover, the respective dopant distribution in the semiconductor layer 103, which, as discussed above, may differ in different device areas of the device 100, may be established by ion implantation, epitaxial growth, diffusion and the like, depending on the overall process strategy. Prior to or after any such processes, the isolation region 104 may be formed on the basis of well-established strategies, for instance, by lithography, etch techniques, oxidation and/or deposition processes, planarization processes, and the like. It should be appreciated that any additional sacrificial material layers, such as a thin silicon dioxide, silicon nitride and the like, are, for convenience, not shown in FIG. 1A.

FIG. 1B schematically illustrates a cross-sectional view of the semiconductor device 100, which may be obtained from the semiconductor device 100 as shown in FIG. 1A. The device 100 may include an implantation mask 106 that is appropriately dimensioned and positioned so as to provide a symmetric dopant distribution in the channel region 153. To this end, the mask 106 may have a length that is less than the length of the future gate electrode structure 160L (see FIG. 1A), wherein the respective length dimension is selected so as to obtain a respective distance D between the source side border 160S and the mask 106, and the same distance D between the mask 106 and the drain side border 160D. For example, the respective distance D may be selected in accordance with device requirements and may, for instance, range from 30-50 nm. Consequently, the implantation mask 106 may be centered above the central portion 153C of the channel region 153 and may, thus, expose portions of the drain side portion 153D and the source side portion 153S of substantially identical dimensions corresponding to the distance D. The implantation mask 106 may be used during a respective implantation process 105, during which an N-type dopant species, such as phosphorous or arsenic, may be implanted with appropriate process parameters so as to obtain a desired dopant concentration in non-exposed areas of the semiconductor layer 103, while the lightly-doped state below the implantation mask 106 may be substantially preserved during the implantation process 105. For example, appropriate implantation parameters for implantation energy and dose may be in the ranges of 1-15 keV and $1e12$-$510^{14}$ $cm^{-2}$, respectively. It should be appreciated that other device areas, for instance, the area of transistor elements of complementary conductivity type, may be covered by respective portions (not shown) of the implantation mask 106.

Thereafter, the further processing may be continued by forming a gate electrode structure on the basis of appropriate manufacturing techniques, wherein the gate electrode structure may be formed within the borders 160S, 160D, thereby obtaining the channel region 153 with the symmetrical dopant distribution as obtained by the implantation process 105. As discussed above, although a transistor element formed on the basis of the semiconductor device 100 as shown in FIG. 1B may meet certain performance criteria, it has been recognized that the symmetric dopant distribution in the channel region 153 of the device 100 may not meet the needs of sophisticated applications and, thus, a non-symmetric dopant distribution may be applied, as will be explained later on in more detail.

Figure 2A:
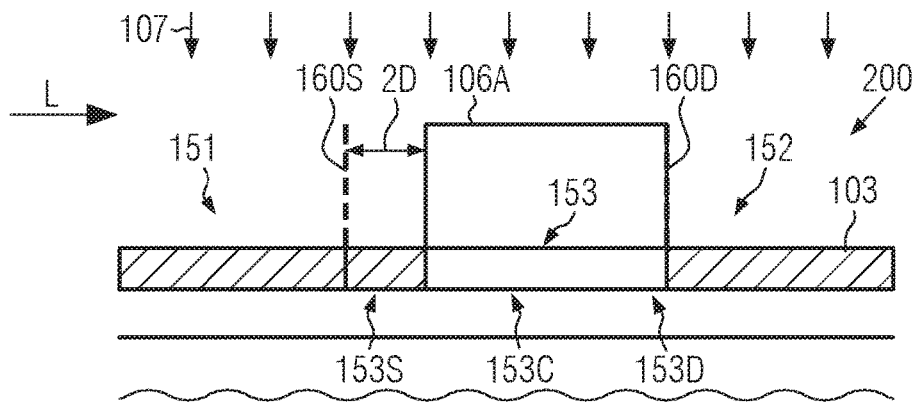
FIGS. 2A and 2B schematically illustrate cross-sectional views of the semiconductor device according to illustrative embodiments wherein an asymmetric dopant profile, i.e., a counter-doped region, may be formed in the channel region on the basis of mask features provided with different lateral alignment with respect to the central channel region.

FIG. 2A schematically illustrates a semiconductor device 200 formed in accordance with the principles of the present disclosure. It is noted that the same reference signs are used as in FIGS. 1A and 1B for components of the semiconductor device 200 that have the same or similar effects and for various details of such components it may also be referred to the semiconductor device 100. The semiconductor device 200 is shown in a manufacturing stage in which an implantation mask 106A may be formed above the channel region 153 so as to be positioned within the borders 160S, 160D, however, laterally shifted along a length direction, indicated by L. For example, in the embodiment shown in FIG. 2A, the implantation mask 106A may be shifted with respect to a centered position such that one lateral end of the mask 106A substantially coincides with the border 160D, thereby substantially completely covering the central portion 153C and the drain side portion 153D of the channel region 153. In some illustrative embodiments, the lateral size and shape of the implantation mask 106A may be similar to the size and shape of the mask 106 as illustrated in FIG. 1B, thereby providing a high degree of process compatibility with the conventional strategy described in the context of FIG. 1B. That is, basically the same lithography masks and process techniques may be used, except for selecting process parameters during the lithography process so as to obtain a desired "overlay error" in order to appropriately position the mask 106A.

It should be appreciated that, due to the non-critical length dimensions of the future gate electrode structure defined by the borders 160S, 160D, a reliable and reproducible "lateral shift" of the mask 106A may be accomplished. On the basis of the implantation mask 106A positioned asymmetrically with respect to the central portion 153C of the channel region 153, one or more implantation processes 107 may be performed so as to introduce a desired type of dopant species. In some illustrative embodiments, the implantation process 107 may result in the incorporation of a counter-dopant species with respect to the dopant species included in the central portion 153C of the channel region 153. For example, when considering an N-type transistor element to be formed, and when the conductivity type of the central portion 153 may be an N-type conductivity, the implantation process 107 may result in the incorporation of a P-type dopant species. In particular, the P-type dopant species may be incorporated in the source side portion 153S of the channel region 153.

It should be appreciated that a different type of transistor element may require the incorporation of an N-type dopant species, depending on the overall transistor characteristics.

As discussed above, the incorporation of the dopant species during the process 107 may be designed so as to avoid undue lattice damage while still providing sufficient dopant concentration, which may be accomplished by performing an implantation process on the basis of boron or boron fluoride (BF2) using an implantation energy of approximately 1-15 keV with a dose of approximately $1 \times 10^{12}$-$1 \times 10^{14}$ cm$^{-2}$. It should be understood, however, that these implantation parameters may be readily modified or selected differently depending on the desired transistor characteristics of a transistor element still to be formed. For example, appropriate process parameters for the process 107 may be readily established on the basis of simulation calculations and/or experiments by varying one or both of these parameters and investigating the resulting characteristics of the finally obtained transistor elements.

Moreover, it is to be noted that, in FIG. 2A, the lateral shift of the implantation mask 106A is illustrated as 2 times the distance D as used in the conventional symmetric approach (see FIG. 1B) in order to use the mask 106A with the same lateral size and shape as in the conventional case. In other illustrative embodiments (not shown), the lateral shift and/or the lateral size of the mask 106A may be selected differently, if considered appropriate for obtaining a specific type of asymmetric dopant concentration in the channel region 153C.

Figure 2B:
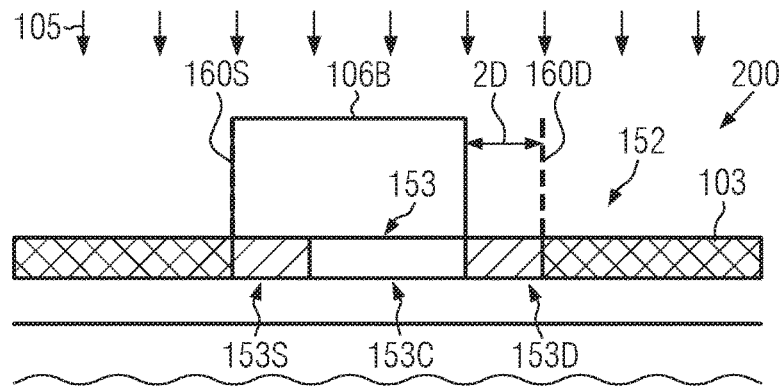

FIG. 2B schematically illustrates the semiconductor device 200 in a further advanced stage, following the step in FIG. 2A, in which a further implantation mask 106B may be provided so as to be laterally shifted with respect to the central portion 153C in order to cover at least a portion of the source side portion 153C of the channel region 153, thereby covering at least a portion of the previously doped region obtained on the basis of the implantation process 107 (see FIG. 2A). For convenience, the previously doped region may also be referred to as the source side portion 153S. In the embodiment shown in FIG. 2B, the implantation mask 106B may be formed so as to coincide with its one lateral end with the border 160S, thereby exposing the drain side portion 153D. When using the mask 106B with substantially identical size and shape as the mask 106A (see FIG. 2A), the resulting distance with respect to the border 160D would be approximately 2D, wherein, as discussed above, any other values may be obtained by controlling the intentional "overlay error" during the formation of the implantation mask 106B and/or by appropriately selecting the size and shape of the mask 106B, as already discussed above.

Thereafter, one or more implantation processes may be performed so as to incorporate a dopant species into non-covered areas of the semiconductor device 200. In one illustrative embodiment, the implantation process, also indicated as 105, may be similar to the implantation process 105 of FIG. 1B so as to incorporate an N-type dopant species in order to provide a general N-type conductivity in the non-covered areas of the semiconductor device 200. For example, implantation parameters may be used, as discussed above, with reference to the process 105 of FIG. 1B. If, however, other device characteristics may have to be established, respective implantation parameters may be readily modified or selected differently, for instance, by using simulation calculations and/or experiments. Consequently, a moderately highly doped region, which, for convenience, may also be indicated as drain side portion 153D, may be formed during the implantation process 105, for instance, in the form of an N-type region. Consequently, in the embodiment shown in FIG. 2B, a non-symmetric dopant distribution in the channel region 153 with respect to the central portion 153C may be achieved, which may result at the side of the future source region 160S in a lateral N-P-N dopant distribution so that the source side portion 153S of the channel region 153 may represent a counter-doped region with respect to the central portion 153C.

It should be appreciated that, for transistors of P-type, the respective dopant types may be inverted so as to obtain an appropriate dopant distribution for a P-type transistor element.

Thereafter, the further processing may be continued by forming a gate electrode structure and raised drain and source regions, as will be discussed later on in more detail with reference to FIG. 4.

Figure 3A:
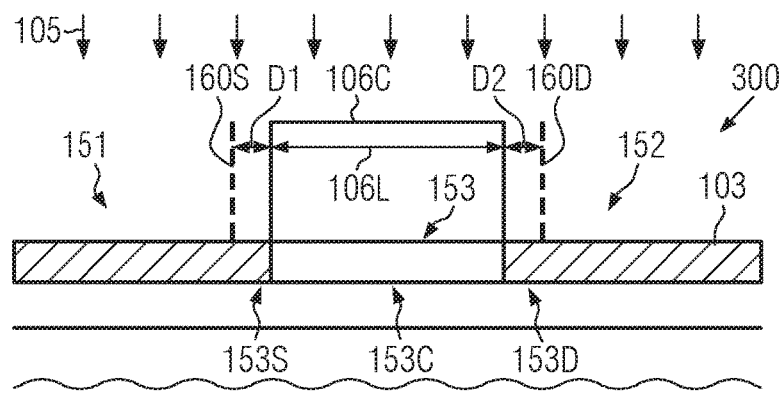
FIGS. 3A and 3B schematically illustrate cross-sectional views of the semiconductor device according to further illustrative embodiments in which a counter-doped region may be provided asymmetrically within the channel region on the basis of overlay and sizing strategies upon providing respective mask features.

FIG. 3A schematically illustrates a semiconductor device 300 according to further illustrative embodiments. Again, the same reference signs are used as in FIGS. 1A, 1B, 2A and 2B for components of the semiconductor device 300 that have the same or similar effects as the components of the devices 100, 200, and for various details of such components it may also be referred to the semiconductor devices 100, 200. The semiconductor device 300 is illustrated in a manufacturing stage in which an implantation mask 106C may be provided so as to cover the central portion 153C and expose parts of the source side portion 153S and the drain side portion 153D of the channel region 153. To this end, the mask 106C may be formed on the basis of a desired mask length 106L, which may, for instance, differ from the length of the mask as used in conventional strategies, such as shown in FIG. 1B, which may be accomplished by providing a specifically designed lithography mask and performing a respective lithography process. In other cases, the length 106L of the mask 106C may be adjusted by using a basic lithography mask and selecting appropriate exposure conditions in order to obtain the target mask length 106L. For example, by applying an increased exposure dose, the length 106L may be reduced, wherein respective exposure parameters may be readily selected on the basis of simulation and/or experiments.

Furthermore, as also discussed above, a specific intentional "overlay error" may be applied so as to laterally position the mask 106C in order to obtain a desired offset D1 and D2 from the borders 160S and 160D, respectively. Consequently, although, in FIG. 3A, offsets D1 and D2 are illustrated as having substantially the same value, different offsets D1, D2 may be achieved by appropriately selecting the respective overlay parameters. Consequently, the mask 106C may be positioned above the channel region 153 so as to expose any desired parts of the source side portion 153S and the drain side portion 153D during a subsequent implantation process 105. For example, the implantation process 105 may be performed on the basis of implantation parameters as discussed above with respect to the implantation process 105 of FIG. 1B and the implantation process 105 of FIG. 2B. Consequently, non-covered areas of the semiconductor layer 103 may receive an appropriate dopant concentration, such as an N-type dopant species for an N-type transistor, as discussed above. It is to be noted that other device areas may be covered by respective portions of the mask 106C in order to avoid incorporation of the respective dopant species, if considered inappropriate.

Figure 3B:
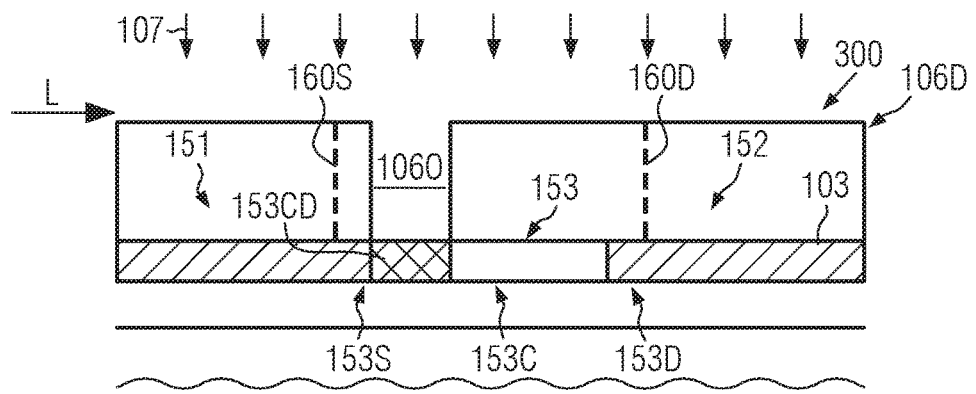

FIG. 3B schematically illustrates the semiconductor device 300 in a further advanced manufacturing stage, i.e., after removal of the mask 106C of FIG. 3A and after having formed a further implantation mask 106D. The mask 106D, including a mask opening 106O, may be provided so as to cover significant portions of the semiconductor device 300 regarding the transistor element still to be formed therein, while on other device areas (not shown), the mask 106D may have any appropriate pattern so as to introduce a desired dopant species during the implantation process 107. In the embodiment shown, the mask 106D may, thus, include the respective opening 106O for exposing a part of the source side portion 153S in order to form therein a counter-doped region 153CD, which is counter-doped with respect to the central portion 153C, as also discussed above. The opening 106O may have a dimension along the length direction L that may correspond with design requirements and may provide, in addition to the lateral shift and/or sizing of the implantation mask 106C (see FIG. 3A), an additional degree of freedom for the positioning and sizing of the counter-doped region 153CD during the implantation process 107. As already discussed, the channel length, i.e., the lateral dimension defined by the borders 160S, 160D, may basically represent a non-critical dimension with respect to the manufacturing platform under consideration, since, typically, highly sophisticated transistor elements of a gate length of 30 nm and significantly less (not shown) may have to be formed in combination with transistor elements still to be formed in the portion of the semiconductor device as shown in FIGS. 1A to 3B. Thus, the opening 106O having a length dimension, i.e., in FIG. 3B, the horizontal dimension of the opening 106O, of 100 nm and less, may be well within the capabilities of the respective lithography techniques.

After having formed the counter-doped region, for instance, in the form of the region 153S in FIG. 2B or the region 153CD, representing a part of the source side portion 153S in FIG. 3B, wherein the respective position and size may be readily adjusted on the basis of the strategies described above with reference to FIGS. 2A to 3B, the further processing may be continued by removing the implantation mask, possibly providing any anneal processes for crystallizing implantation-induced damage and the like.

As also discussed above, it should be noted that any additional sacrificial material layers, such as silicon dioxide, silicon nitride and the like, which may be used as screening layers for enhancing the effects of the respective implantation processes and protecting the underlying thin semiconductor layer 103, may be provided without being illustrated in the figures, and may also be removed or may be preserved, depending on the further process strategy.

FIG. 4 schematically illustrates a cross-sectional view of a semiconductor device 400 in a further advanced manufacturing stage compared to the previously shown manufacturing stages. Also, the same reference signs are used as in the previous figures for components of the semiconductor device 400 that have the same or similar effects, and for various details of such components it may also be referred to the semiconductor devices 100, 200 and 300. As illustrated, a transistor element 150 may be formed on the basis of the semiconductor layer 103 having formed therein the channel region 153. The channel region 153 may be covered by the gate electrode structure 160, the length dimension of which is substantially determined by the borders 160S, 160D, as previously discussed. Furthermore, the gate electrode structure 160 may include a sidewall spacer structure 163, which, may or may not have been included in the previously defined length dimension. For example, in the embodiment shown in FIG. 4, the initially defined length dimension of the gate electrode structure 160 may correspond to the extension of a gate dielectric layer 161 and gate electrode material(s) 162, while the sidewall spacer structure 163 may contribute to additional geometric length of the gate electrode structure 160, however, without being included in the "electronic" length dimension defined by the borders 160S, 160D. In other cases, the initial length dimension of the gate electrode structure 160 may be defined by taking into consideration the lateral extension of the sidewall spacer structure 163.

Furthermore, as discussed above, the gate dielectric material 161 may include any appropriate dielectric material providing the required breakthrough voltage in order to enable the operation of the transistor element 150 with a required span of supply or gate voltages, for instance, 1-3.3 V and even higher. For example, the gate dielectric material 161 may include silicon dioxide, silicon nitride, silicon oxynitride, with a thickness of approximately 2-6 nm and even greater, depending on the overall device requirements. In other cases, a high-k dielectric material layer stack, possibly including a standard dielectric material in combination with appropriate metal-containing barrier materials and electrode materials, may be provided in the gate electrode structure 160. Consequently, the electrode material 162 may include metal-containing materials, semiconductor material in amorphous and/or polycrystalline configuration, and the like. It should be further noted that the material 162, if provided in the form of a semiconductor material, may still receive a highly conductive semiconductor metal compound, for instance, in the form of a silicide and the like, in a later manufacturing stage.

Moreover, the source region 151 and the drain region 152 may be formed on the basis of a highly doped crystalline semiconductor material, such as silicon, silicon/carbide, silicon/germanium and the like, wherein a respective dopant species of appropriate conductivity type may be incorporated. Also in this case, enhancing the contact resistivity may be accomplished by providing a highly conductive metal-containing semiconductor compound in a later manufacturing stage, if considered appropriate.

Consequently, the transistor element 150 may have appropriate length dimensions, such as 100 nm and even higher, while the channel region 153 may be formed on the basis of the very thin semiconductor layer 103 and may, in some illustrative embodiments, provide a substantially fully depleted configuration at least in a part of the channel region 153, for instance, in the central portion 153C. On the other hand, a counter-doped area, for instance, the counter-doped region 153CD, may be positioned in the source side of the channel region 153C, i.e., within the source side portion 153S, thereby imparting specific electronic characteristics to the channel region 153, as will be discussed later on in more detail.

In some illustrative embodiments, as illustrated in FIG. 4, the entire channel region 153 is vertically isolated by the buried insulating layer 102, thereby contributing to reduced parasitic capacitance of the transistor 150. Moreover, in some illustrative embodiments, a contact region 172 may be provided, for instance, in the form of a crystalline highly doped semiconductor material, possibly in combination with a metal-containing semiconductor metal compound, so as to connect to a portion 101B of the substrate 101, which may be appropriately doped so as to provide a desired conductivity type and electrically connect to the contact region 172. Consequently, by appropriately doping the region 101B and applying an appropriate control voltage to the contact region 172, enhanced controllability of the channel region 153 may be accomplished, if considered appropriate.

The semiconductor device 400 as shown in FIG. 4 may be formed on the basis of the following processes. After having established the channel region 153 with the counter-doped regions 153CD or 153S, the gate electrode structure 160 may be formed, for instance, by forming one or more appropriate dielectric materials for the gate dielectric layer 161, followed by the deposition of one or more appropriate electrode materials, such as the one or more materials 162. Thereafter, appropriate lithography processes may be applied so as to form a respective etch mask in order to obtain a gate electrode structure 160 with the required length dimension. To this end, any well-established process strategies may be applied. At any appropriate stage, one or more of the spacer elements of the sidewall spacer structure 163 may be formed by well-established deposition and etch techniques. Thereafter, the drain and source regions 152, 151 may be formed, possibly in combination with the contact region 172, by well-established epitaxial growth techniques, during which an appropriate dopant species may be incorporated by establishing appropriate deposition atmospheres.

As also discussed above, at any appropriate manufacturing stage, one or more anneal processes may be applied so as to re-crystallize implantation-induced damage and adjust the final dopant profiles, for instance, by inducing a certain degree of lateral diffusion, if considered appropriate.

Thereafter, the further processing may be continued, for instance, by forming a metal-containing semiconductor compound in exposed device areas, such as the contact region 172, the drain and source regions 152, 151, and the electrode material 162, on the basis of well-established techniques. Thereafter, contact elements may be formed so as to provide an interface between the various circuit elements, such as the transistor 150, and a metallization system still to be formed.

With reference to FIGS. 5-8, transistor characteristics of transistors having a counter-doped region in the source side portion of the channel region may be illustrated in comparison with conventional transistor elements formed on the basis of a symmetric dopant distribution in the respective channel region.

FIG. 5 schematically illustrates a cross-sectional view of a concept transistor or transistor design formed on the basis of a conventional strategy, as, for instance, described with reference to FIG. 1B. That is, a conventional semiconductor device 500 may include a transistor 250C including a gate electrode structure 260 and a source region 251 and a drain region 252. The transistor 250C may be formed on the basis of a substrate 201, such as a silicon substrate, with a buried insulating layer 202 above which may be provided a thin semiconductor layer, such as a silicon layer 203, having a thickness of 15 nm and less. As discussed above, a channel region 253 of the transistor 250C may have a substantially symmetric dopant profile along the length direction L, which may be substantially determined by the dopant concentration initially provided for the semiconductor layer 203, as, for instance, described in the context of FIG. 1A.

Figure 6A:
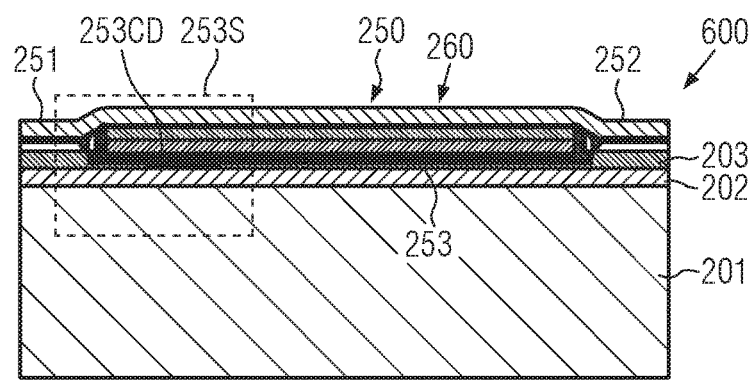
FIG. 6A schematically illustrates the concept or design of a transistor element with asymmetric dopant profile, i.e., a counter-doped region at the source side of the transistor, according to illustrative embodiments.

FIG. 6A schematically illustrates a semiconductor device 600 having basically the same configuration as the conventional device 500 with respect to lateral dimensions, the basic structure of source and drain regions, and the gate electrode structure. That is, the semiconductor device 600 may include a transistor element or its design 250, including a gate electrode structure 260 and source and drain regions 251, 252. A channel region 253 may be formed in the semiconductor layer 203, which, in turn, may be provided on the buried insulating layer 202, as also discussed in the context of the conventional device 500. The channel region 253 of the device 600, however, may include the source side portion 253S that provides an asymmetric dopant distribution, for instance, on the basis of a counter-doped region 253CD provided therein.

Figure 6B:
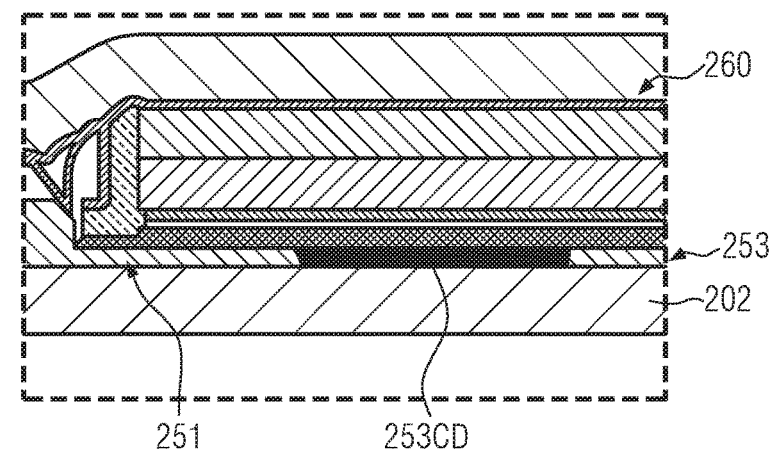
FIG. 6B schematically illustrates an enlarged view of a portion of the transistor element of FIG. 6A.

FIG. 6B schematically illustrates an enlarged view of a portion of the semiconductor device 600 included in the dotted rectangle of FIG. 6A. As illustrated, the bottom of the source region 251 may have incorporated therein a moderately high dopant concentration, which may decrease along the length direction in the channel region 253. For example, if the transistor 250 may represent an N-type transistor, a moderately high N-dopant concentration at the source side may be present, which may become lower along the length direction. The counter-doped region 253CD is positioned next to the source region and may also be positioned adjacent to the central portion 253C, which may have a moderately low N-type dopant concentration, as also discussed above. Consequently, in the lateral or length direction, an N-P-N configuration may be obtained in the channel region 253.

In contrast, in the conventional transistor 250C as shown in FIG. 5, a substantially uniform lateral dopant profile, except for the areas adjacent to the source region 251 and the drain region 252, may be provided in the channel region 253.

Figure 7:
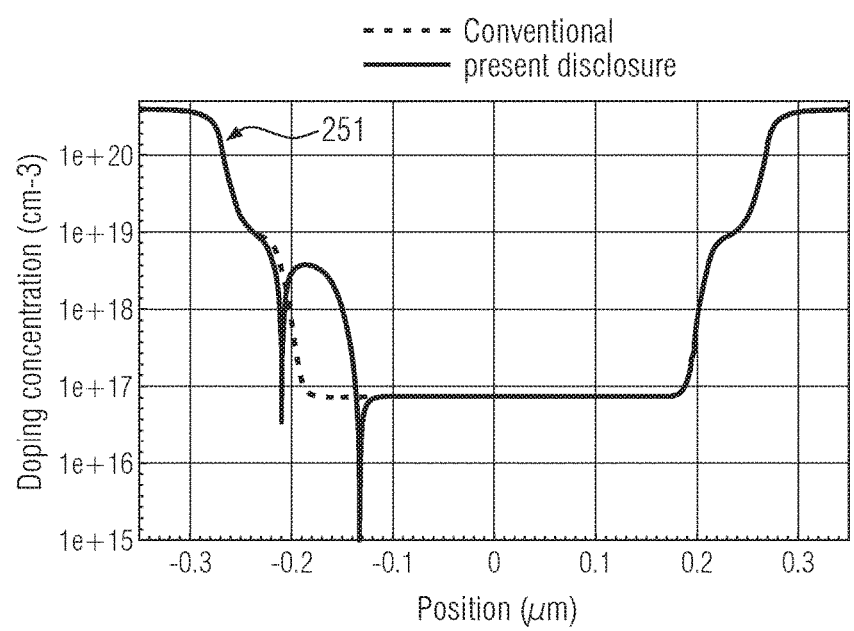
FIG. 7 schematically illustrates the qualitative progression of the dopant profile along a length direction of the transistor element illustrated in FIGS. 6A and 6B, according to illustrative embodiments.

FIG. 7 schematically illustrates the doping profile along the length direction in the semiconductor layer and the channel region of the device 250C of FIG. 5 (dotted curve) and the transistor 250 of, e.g., FIG. 6A, according to illustrative embodiments of the present disclosure (solid line). As is evident, at the source region 251, both devices may have substantially the same dopant concentration, obtained by implanting dopant species into the base semiconductor layer 203 and providing in situ doped epitaxially grown semiconductor material. Upon moving to the right, the dopant concentration becomes increasingly lower and finally takes on the initial low dopant concentration within the main portion of the channel region, as indicated by the dotted line. On the other hand, the dopant concentration in the transistor 250 may also decrease, but at the counter-doped region 253CD, forming a PN junction with the source region 251, significant increase of the dopant concentration may occur, however, with opposite conductivity type, which may also rapidly decrease, thereby forming a gentle PN junction with the central portion 253C, thereby finally taking on the moderately low dopant concentration and exhibiting substantially the same progression as the conventional device 250C.

Figure 8:
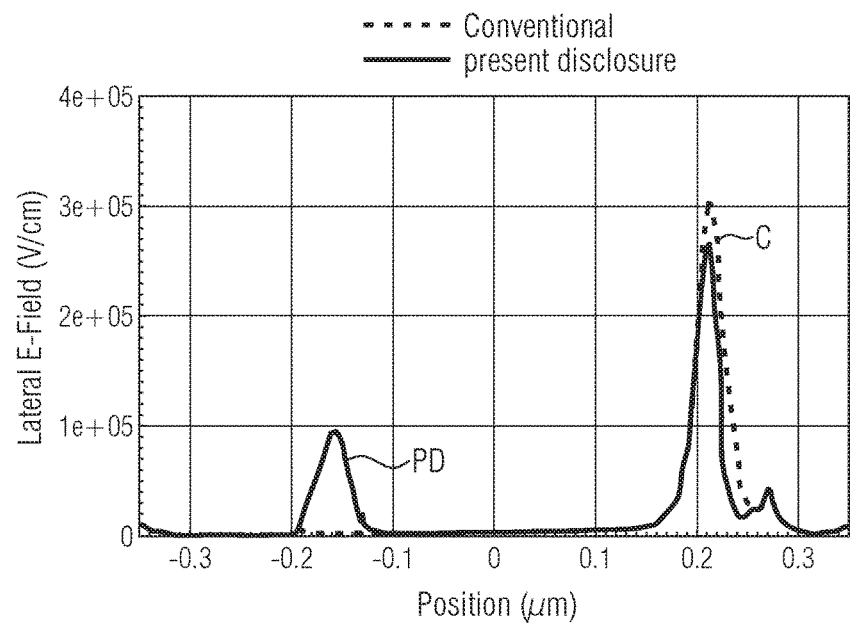
FIG. 8 schematically illustrates the electric field distribution along the length direction for certain operating conditions for the transistor element of FIGS. 6A and 6B.

FIG. 8 qualitatively illustrates the respective progression of the lateral electric field along the channel regions of the conventional device 250C of FIG. 5 and the transistor 250 of, e.g., FIG. 6A, in accordance with the principles of the present disclosure. As illustrated, the lateral electric field is illustrated for specific operating conditions, such as for a drive current of 10 µA/µm at a drain voltage Vd of 1.25 V. The electric field distribution along the length direction in the channel region for the conventional transistor is indicated by curve C, while the electric field distribution for the transistor according to the present disclosure is indicated by curve PD. As is evident, a pronounced peak of the lateral electric field may be observed at the source side of the channel region due to the presence of the counter-doped region, while the remaining progression of the lateral electric field is quite similar to the field of the conventional transistor. Consequently, due to the pronounced lateral electric field at the source side of the transistor of the present disclosure, a significant higher injection current may be obtained, which, in turn, may translate into superior performance characteristics.

Figure 9A:
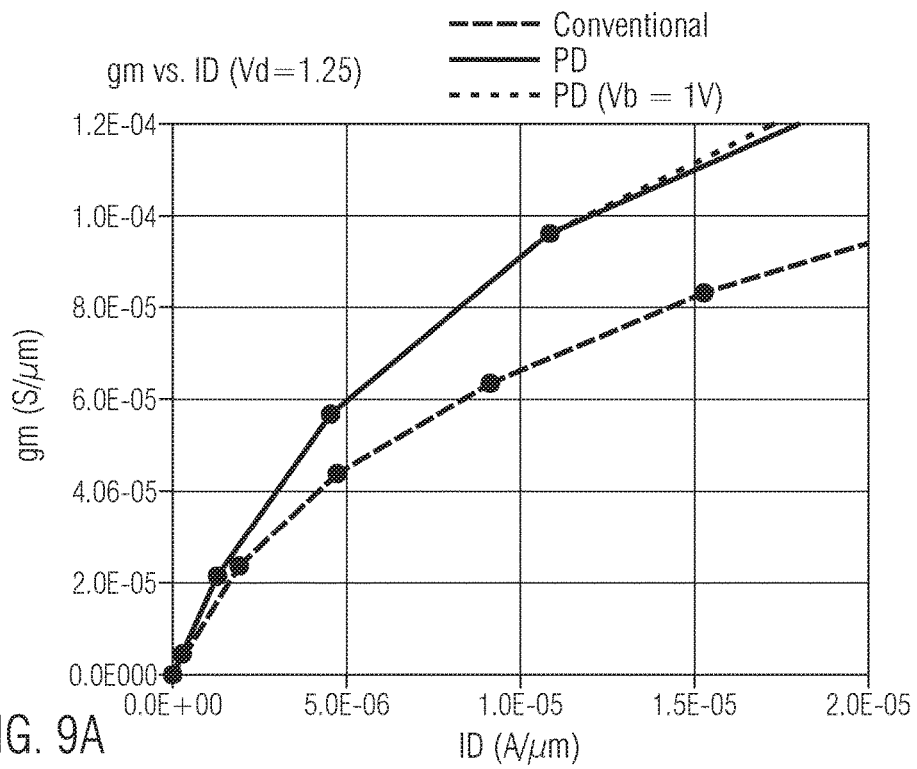
FIGS. 9A and 9B schematically illustrate transconductance and drive current of the transistor element of FIGS. 6A and 6B versus the conventional design as illustrated in FIG. 5.

FIG. 9A schematically illustrates the transconductance gm versus the drive current for a drain voltage of 1.25 V. As is evident, the curve of the conventional device has a significantly flatter progression for increased drive currents compared to curves PD of the transistor element of the present disclosure. That is, the transconductance at higher drive currents may be significantly enhanced compared to the transconductance of the conventional device, for instance, by approximately 30% at a drive current of approximately $1.0 \times 10^{-5}$ A/µm. Thus, the corresponding superior "response" of the drive current for a given gate voltage, i.e., the transconductance, may be achieved by the pronounced peak of the lateral electric field distribution as shown in FIG. 8.

Figure 9B:
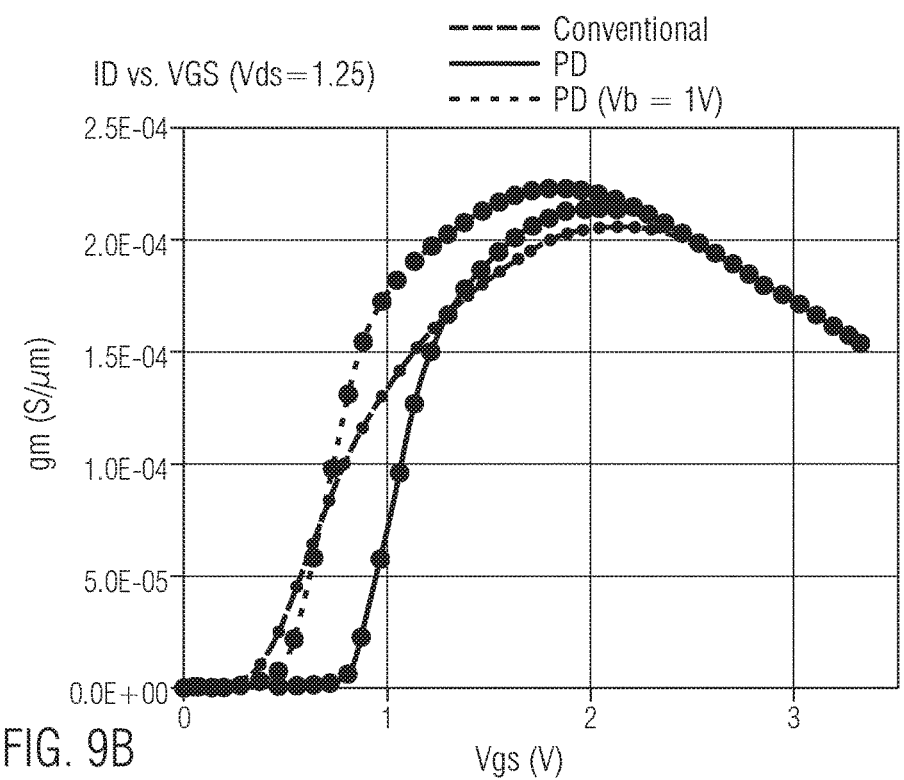

FIG. 9B schematically illustrated the transistor behavior when plotting the drive current versus the gate voltage for a drain voltage of 1.25 V. As is evident, the conventional device has a less pronounced dependency on the gate voltage compared to the devices in accordance with the present disclosure indicated by the curves PD. That is, upon lower gate voltages, the conventional device results in a less steep increase of the drive current compared to the devices including a counter-doped region in the channel region, wherein, as indicated by the two different curves PD with and without back bias voltage, the corresponding steep and well-defined increase of the drive current may be shifted and thus efficiently controlled on the basis of the back bias voltage.

As a consequence, significant performance gain may be achieved for transistor elements required to be formed on the basis of a thin base semiconductor material and designed for operating at higher operating voltages due to the presence of a counter-doped region near the source side of the channel region. The counter-doped region provides a peak of the lateral electric field in the vicinity of the source region, thereby increasing the injection current, thus providing superior overall performance of the transistor compared to conventional transistor elements of similar configuration, however, lacking a corresponding counter-doped region.

With reference to FIGS. 10A-10D, further illustrative embodiments will now be described in more detail, in which a high degree of compatibility with conventional process strategies may be achieved in order to substantially avoid additional process steps.

Figure 10A:
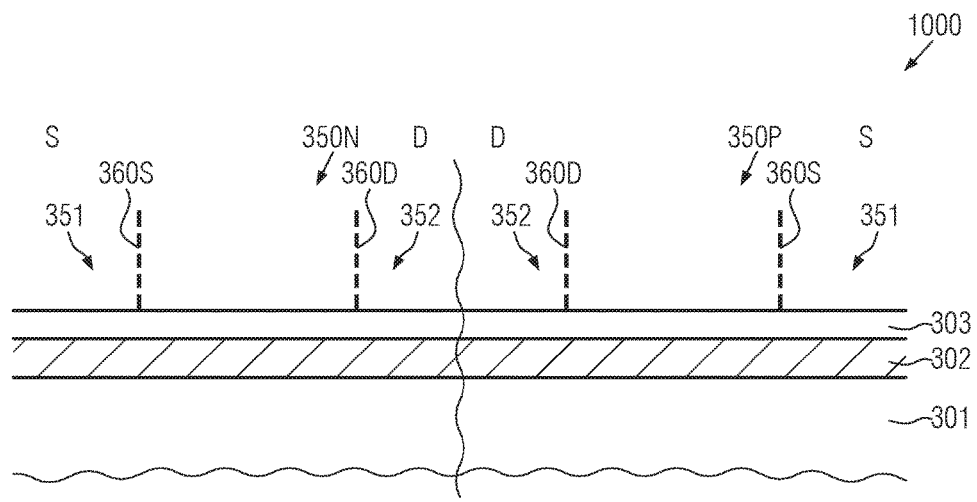
FIGS. 10A-10D schematically illustrate cross-sectional views of a semiconductor device during various manufacturing stages, wherein a counter-doped region may be positioned in the channel region on the basis of a mask regime that may not require any additional steps compared to a conventional process regime for forming transistor elements with symmetric configuration of the channel region.

FIG. 10A schematically illustrates a cross-sectional view of the semiconductor device 1000 comprising a first transistor element 350N, still to be formed, and a second transistor element 350P, still to be formed, at a manufacturing stage in which a substrate 301, a buried insulating layer 302 and a base semiconductor layer 303 may be provided. With respect to the components, 301, 302, 303, the same criteria may apply as previously discussed in the context of the semiconductor devices 100, 200, 300, 400, 500 and 600. Furthermore, in the transistor elements 350N, 350P, which may represent an N-type transistor and a P-type transistor, respectively, respective areas for future gate electrode structures 360 and future drain and source regions 352, 351 may be defined. For example, the respective length of the gate electrode structures 360 and their positions may be defined by respective borders 360S, 360D, as also previously discussed. Furthermore, in some illustrative embodiments, the semiconductor layer 303 in the area of the transistor 350N may be slightly pre-doped, for instance, it may be N-doped, while the semiconductor layer 303 in the area of the transistor 350P may be pre-doped with a dopant species of inverse conductivity type, for instance, a P-type.

The semiconductor device 1000 as illustrated in FIG. 10A may be formed on the basis of well-established process techniques, as also described above with reference to the semiconductor device 100.

Figure 10B:
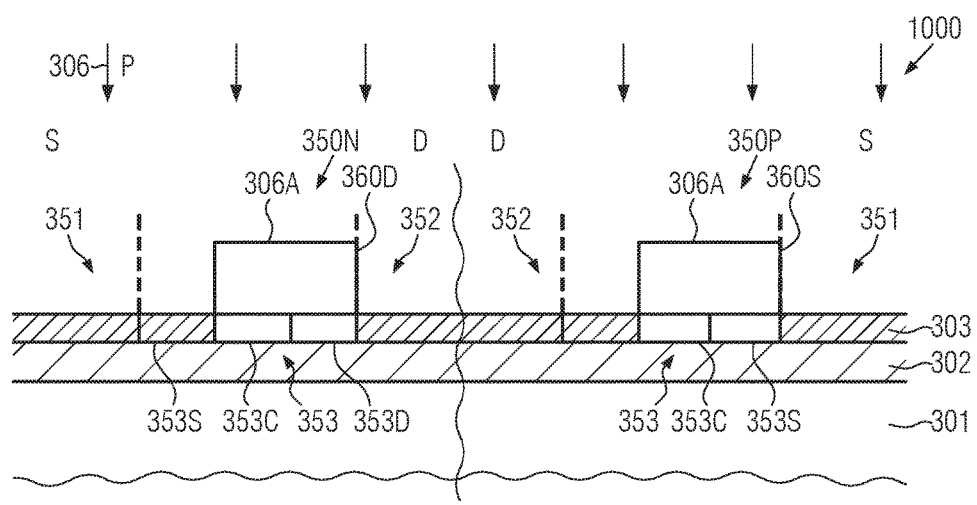

FIG. 10B schematically illustrates the semiconductor device 1000 in a further advanced manufacturing stage. As illustrated, an implantation mask 306A may be formed so as to cover a specific portion of the channel region 353. For example, in the embodiment shown in FIG. 10B, the mask 306A may be patterned so as to be positioned asymmetric with respect to a center of the respective channel regions 353. For example, respective end portions of the mask features 306A may coincide with the respective borders 360D of the first transistor 350N and with the border 360S for the second transistor 350P. It should be appreciated, however, that any other lateral shift of the respective mask features 306A may be implemented in accordance with overall device requirements, as is also discussed above in the context of FIGS. 2A-3B. Similarly, a lateral size of the mask features 306A may be selected in accordance with device requirements in view of obtaining a desired asymmetric dopant concentration in the respective channel regions 353. For example, the respective shift of the mask features 306A may be obtained during a respective overlay process on the basis of an appropriate lithography mask during a single process sequence. Consequently, during a subsequent implantation process 306, for instance, for incorporating a P-type dopant species, any non-covered areas of the semiconductor device 1000 receive a respective moderately high dopant concentration. For example, in the first transistor 350N, the corresponding newly introduced dopant species may result in a net P-dopant concentration, while below the respective mask feature 306A, the previously implemented lightly N-doped dopant concentration is substantially preserved. Similarly, in the second transistor 350P, any non-covered areas may additionally result in a P-dopant species, thereby increasing even further the previously implemented lightly P-doped concentration, while the area covered by the respective resist mask 306A may still preserve its previously implemented lightly P-doped dopant concentration.

Figure 10C:
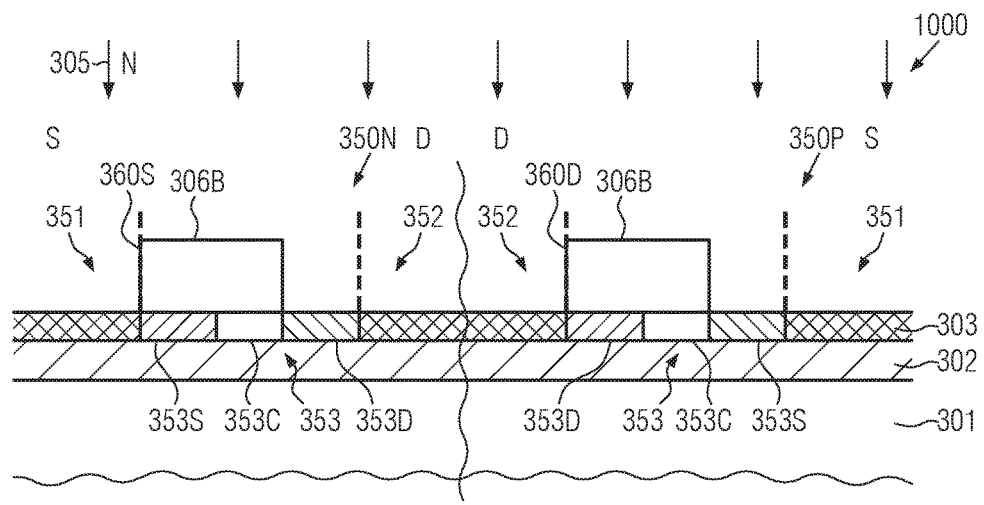

FIG. 10C schematically illustrates the semiconductor device 1000 in a further advanced manufacturing stage after having removed the mask 306A of FIG. 10B and having provided a further implantation mask 306B having respective mask features, also indicated as 306B. In the embodiment shown, the mask features 306B may be shifted to the left so as to coincide with the respective borders 306S for the first transistor 350N and the border 306D for the second transistor 350P. A respective intentional "overlay error" may be implemented on the basis of specifically selected parameters, as also discussed above. Moreover, with respect to the lateral position and the size of the mask features 306B, the same criteria may apply as previously discussed in the context of the semiconductor device 200.

Consequently, during a further implantation process 305, an appropriate dopant species may be incorporated, for instance, an N-dopant species, thereby achieving a net N-type dopant concentration in the future drain region 352, a net N-type conductivity in the future source region 351, a moderately high dopant concentration of N-type conductivity in a drain side portion 353D of the channel region 353, the initially lightly N-doped concentration in the central portion 353C and a net counter-doped concentration in the source side portion 353S of the channel region 353.

On the other hand, in the area of the second transistor 350P, a net P-type dopant concentration may be achieved in the future source region 351, while a net counter-doped concentration may be achieved in a source side portion 353S due to its exposure during the implantation process 305. On the other hand, a central portion 353C may have the initially slightly P-doped concentration, while a drain side portion 353D may have a moderately high P-type concentration due to the previous implantation process 307 (see FIG. 10B). Moreover, the future drain region 352 may have a net P-type concentration.

Consequently, both the first transistor 350N and the second transistor 350P may have respective channel regions including a corresponding counter-doped region at the respective source side portions 353S of the channel region 353, which may be accomplished on the basis of a process sequence without requiring any additional masking steps or implantation processes. That is, instead of completely covering the area of one type of transistor element, while forming the respective drain and source base dopant concentrations in combination with the respective counter-doped region in the channel region of the other type of transistor, the respective implantation masks may be formed so as to provide the respective mask features for both types of transistors, wherein the respective non-symmetric sizing and/or positioning of the respective mask features may be accomplished during a single respective lithography sequence for both types of mask features. Consequently, the number of additional process steps required for implementing a counter-doped source side region in the respective channel regions may remain low or even no additional process step may be required with respect to a conventional process strategy, as, for instance, described above with reference to FIG. 1B.

Figure 10D:
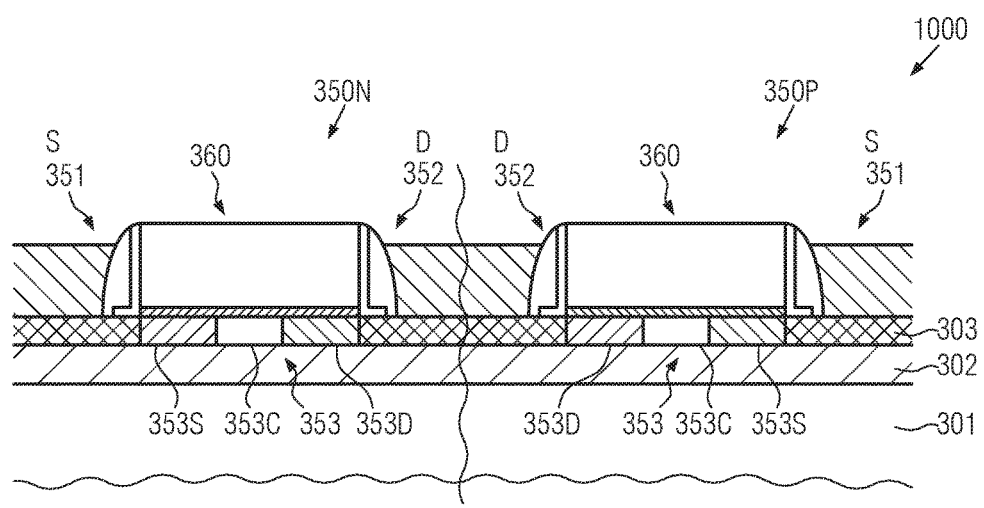

FIG. 10D schematically illustrates the semiconductor device 1000 in a further advanced manufacturing stage. As shown, the transistor 350N may be substantially completed and may include the gate electrode structure 360 and the drain and source regions 352, 351 in a raised configuration. Moreover, the channel region 353 may include the counter-doped region 353S at the source side and may, thus, form, in combination with the source region 351 and the central portion 353C a lateral N-P-N configuration.

Likewise, the transistor 350P may include the gate electrode structure 360 with the channel region 353 including the lightly doped central portion 353C and the counter-doped portion 353S at the source side of the transistor 350P. Moreover, the source and drain regions 351, 352 may be provided with a raised configuration. It should be appreciated that the configuration of the gate electrode structures 360 and of the raised drain and source region 352, 351 may be similar to the respective configurations previously described with reference to the semiconductor device 400, for instance, as shown in FIG. 4.

Similarly, any process strategies for forming the respective components may be similar or the same as previously discussed in the context of the semiconductor device 400.

As a result, the present disclosure provides manufacturing techniques and respective semiconductor devices in which transistor elements designed for operation at elevated supply voltages and/or for analog circuit portions may be formed on the basis of a platform that requires the provision of a very thin base semiconductor material, for instance, for forming sophisticated SOI fully depleted transistor elements with a gate length of 30 nm and less. In order to enhance overall transistor performance of transistors having a less critical gate length of 50 nm and even significantly higher, as may be required for analog circuit portions and/or "high" voltage transistor elements, the lateral dopant concentration, i.e., the dopant concentration along a length direction of the transistor elements in the channel region, may be modified by incorporating a counter-doped region at the source side of the gate electrode structure. In some illustrative embodiments, an appropriate lateral dopant profile may be implemented prior to forming the respective gate electrode structures. Due to the incorporation of the counter-doped region at the source side of the channel region, a respective peak of the lateral electric field distribution may be obtained, thereby increasing injection currents, which may translate into superior overall transistor performance.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a short-hand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
   forming a channel region for a fully depleted transistor element in a semiconductor layer, said channel region having a doped central portion;
   forming a counter-doped region in said channel region, said counter-doped region being counter-doped with respect to said doped central portion, wherein forming said counter-doped region comprises performing a sequence of implantation processes while masking different portions of said channel region during at least two implantation processes of said sequence; and forming a gate electrode structure above said channel region.

2. The method of claim 1, wherein said counter-doped region is formed prior to forming said gate electrode structure.

3. The method of claim 1, wherein masking different portions of said channel region comprises forming a first mask covering a first portion of said channel region and, after performing one of said at least two implantation processes, forming a second mask covering a second portion of said channel region.

4. The method of claim 3, wherein said first and second masks are formed with substantially equal length but different lateral position on said channel region.

5. The method of claim 3, wherein a first implantation process is performed by using said first mask so as to introduce a first dopant species into a source side channel portion exposed by said first mask and wherein a second implantation process is performed by using said second mask so as to introduce a second dopant species that differs from said first dopant species into a drain side channel portion exposed by said second mask.

6. The method of claim 3, wherein a first implantation process is performed by using said first mask so as to introduce a first dopant species into a first source side channel portion and a drain side channel portion exposed by said first mask and wherein a second implantation process is performed by using said second mask so as to introduce a second dopant species differing from said first dopant species into a second source side channel portion exposed by said second mask.

7. The method of claim 6, wherein said first source side channel portion and said drain side channel portion are covered by said second mask when said second implantation process is performed.

8. The method of claim 1, further comprising forming another counter-doped region in a channel region of another fully depleted transistor element during said sequence of implantation processes, wherein said another fully depleted transistor element is of complementary conductivity type relative to said fully depleted transistor element.

9. The method of claim 1, wherein said semiconductor layer is formed on a buried insulating layer and has a thickness of approximately 15 nm or less.

10. The method of claim 1, further comprising pre-doping said channel region with a dopant species of a same conductivity type as is used for drain and source regions and forming said counter-doped region in said pre-doped channel region.

11. The method of claim 1, wherein said counter-doped region is formed at a source side so as to be positioned asymmetrically in a channel length direction with respect to a center of said channel region.

12. A method, comprising:
forming a counter-doped region in a channel region of a transistor element so as to be positioned asymmetrically in a channel length direction with respect to a center of said channel region, said counter-doped region being counter-doped with respect to a doped central portion of said channel region, wherein forming said counter-doped region comprises performing a first implantation process using a first dopant species and a first implantation mask that exposes said source side portion, and performing a second implantation process using a second dopant species differing from said first dopant species and a second implantation mask that covers said counter-doped region; and
after forming said counter-doped region, forming a gate electrode structure above said channel region.

13. The method of claim 12, wherein said counter-doped region is formed in a source side portion of said channel region.

14. The method of claim 12, wherein said first and second implantation masks are formed on the basis of a same lithography mask by using different overlay parameters upon forming said first and second implantation masks.

15. The method of claim 12, wherein said first implantation process is performed after said second implantation process.

* * * * *